United States Patent
Tao et al.

(10) Patent No.: US 6,174,818 B1
(45) Date of Patent: Jan. 16, 2001

(54) METHOD OF PATTERNING NARROW GATE ELECTRODE

(75) Inventors: Hun-Jan Tao, Hsinchu; Huan-Just Lin; Hung-Chang Hsieh, both of Hsin-Chu; Chu-Yun Fu, Taipei; Ying-Ying Wang, Hsin-Chu; Chia-Shiung Tsai, Hsin-Chu; Fang-Cheng Chen, Hsin-Chu, all of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/443,424

(22) Filed: Nov. 19, 1999

(51) Int. Cl.[7] .................................................. H01L 21/302
(52) U.S. Cl. ......................... 438/733; 438/736; 438/738
(58) Field of Search .................................. 437/733, 736, 437/738

(56) References Cited

U.S. PATENT DOCUMENTS

| | | |
|---|---|---|
| 5,345,586 * | 9/1994 | Keller . |
| 5,346,586 | 9/1994 | Keller .................................. 156/656 |
| 5,512,506 * | 4/1996 | Chang et al. . |
| 5,674,409 * | 10/1997 | Muller . |
| 5,762,714 * | 6/1998 | Mohn et al. . |
| 5,767,018 * | 6/1998 | Bell . |
| 5,851,926 * | 12/1998 | Kumar et al. . |
| 5,914,270 * | 6/1999 | Coutos-Thevenot et al. . |
| 5,914,276 | 6/1999 | Shin et al. ............................ 438/714 |
| 6,008,135 * | 12/1999 | Oh et al. . |
| 6,013,574 * | 1/2000 | Hause et al. . |

* cited by examiner

Primary Examiner—Long Pham
(74) Attorney, Agent, or Firm—George O. Saile; Stephen B. Ackerman

(57) ABSTRACT

A process is described for forming very narrow polysilicon gate lines for use as gate electrodes in FETs. The process uses a consumable hard mask of silicon oxynitride covered by a thin layer of silicon oxide during the etching of the polysilicon. The thicknesses of the two layers that make up the hard mask are chosen so that the structure also serves as an ARC for the photoresist coating immediately above it. A relatively thin layer of the latter is used in order to improve resolution. After the photoresist has been patterned it may be trimmed or it may be removed and re-formed, since the silicon oxide layer provides protection for the underlying silicon oxynitride. After the hard mask has been formed, all photoresist is removed and the polysilicon is etched. During etching there is simultaneous removal of the silicon oxide layer and part of the silicon oxynitride as well.

15 Claims, 3 Drawing Sheets

US 6,174,818 B1

METHOD OF PATTERNING NARROW GATE ELECTRODE

FIELD OF THE INVENTION

The invention relates to the general field of photolithographic etching with particular reference to the formation of narrow lines such as FET gates.

BACKGROUND OF THE INVENTION

Silicon integrated circuits continue to grow ever denser, requiring that the gate oxides in FETs (field effect transistors) be thinner and, in particular, that the gate electrodes in the FETs become narrower. Said gate electrodes are most usually made of polysilicon and, until relatively recently, were patterned by conventional use of photoresist masking.

However, as gates have grown narrower, use of a photoresist mask has become increasingly problematical. There are a number of reasons for this—undercutting of the photoresist during etching, which can be tolerated in wider lines, introduces a degree of uncertainty into the process which can no longer be tolerated in very narrow lines; because of the high level of resolution required, the photoresist layer must be thinner than that used for etching wider lines; sensitivity of photoresist-based processes to process parameters such as exposure wavelength, brand of resist used, etc. becomes more of a problem; and line width control, and reduction of line edge roughness, through use of photoresist trimming, becomes more difficult if the photoresist is also used as the primary etch mask.

Another factor that needs to be considered when forming structures through etching is the need to use an ARC (anti-reflection coating). This is laid down just below the photoresist layer to prevent formation of standing wave patterns within the resist. ARCs may be either organic or inorganic, the former being relatively thick while the latter are relatively thin. For reasons that will become apparent, an inorganic ARC is part of the present invention.

A routine search of the prior art was performed but no references that describe the exact process taught by the present invention were discovered. Several references of interest were, however, encountered. For example, Bell (U.S. Pat. No. 5,767,018) determined that a process being used by him to etch a silicon oxynitride ARC caused pitting of the polysilicon gate structure. Polymer formation during etching was considered to be a large contributor to this problem so an etchant that did not form a polymer was selected. This allowed a passivating coating to form on the sidewalls as the polysilicon was etched (using $HBr/Cl_2/He$—$O_2$). The final step was an anisotropic etch that cleaned the top surface of the gate without removing the protective layer from the sidewalls.

Kumar et al. (U.S. Pat. No. 5,851,926) teach use of a tungsten silicide hard mask together with an $NF_3$ and $Cl_2$ etch to achieve vertical edges for a polysilicon gate. Keller (U.S. Pat. No. 5,346,586) etches a polysilicon layer that has been coated with a silicide layer by first forming an oxide hard mask and then successively etching the suicide and polysilicon layers.

Muller (U.S. Pat. No. 5,674,409) shows a photoresist trim process for forming lines while Shin et al. (U.S. pat. No. 5,914,276) describe a process for etching a polycide/polysilicon gate.

SUMMARY OF THE INVENTION

It has been an object of the present invention to provide a process for forming a very narrow line through photolithography and etching.

Another object has been that said process be optimized for the formation of a gate electrode of polysilicon for a field effect transistor.

A further object has been that said process be compatible with photoresist trimming and photo rework.

These objects have been achieved by using a hard mask of silicon oxynitride covered by a thin layer of silicon oxide during the etching of the polysilicon to form the gate. The thicknesses of the two layers that make up the hard mask are chosen so that the structure also serves as an ARC for the photoresist coating immediately above it. A relatively thin layer of the latter is used in order to improve resolution. After the photoresist has been patterned it may be trimmed or it may be removed and re-formed, with the silicon oxide layer providing protection for the underlying silicon oxynitride. After the hard mask has been formed, all photoresist is removed and the polysilicon is etched. This also leads to removal of the silicon oxide layer and part of the silicon oxynitride as well.

DESCRIPTION OF THE PREFERRED EMBODIMENTS

As discussed above, photoresist layers require the presence of an ARC at their lower surface. It was also noted that use of a photoresist mask for the direct etching of very fine lines introduces a number of problems. The present invention combines the ARC function with substitution of a consumable hard mask for the photoresist mask during the etching step.

Thus, a key feature of the present invention has been the selection of the ARC/hard mask material. Even if a suitable organic material was available to function as the required hard mask, its thickness would be too great for achieving the level of resolution required for etching very fine lines. Thus, an inorganic ARC/hard mask material was the first requirement. Silicon oxynitride is known to be a suitable ARC material but, per se, is not suitable for use as a hard mask because it is attacked to some degree by the preferred etchant used for etching polysilicon ($HBr/Cl_2/He$—$O_2$, as mentioned above).

This problem has been solved in the present invention by depositing a thin layer of silicon oxide over the silicon oxynitride layer. Although this material is also attacked by the preferred etchant and is, in fact, completely consumed during the etching of the polysilicon, it is sufficiently resistant to attack to delay etching of the oxynitride layer so that some oxynitride still remains to act as a mask at the time that the polysilicon has been fully etched.

Figure 1:
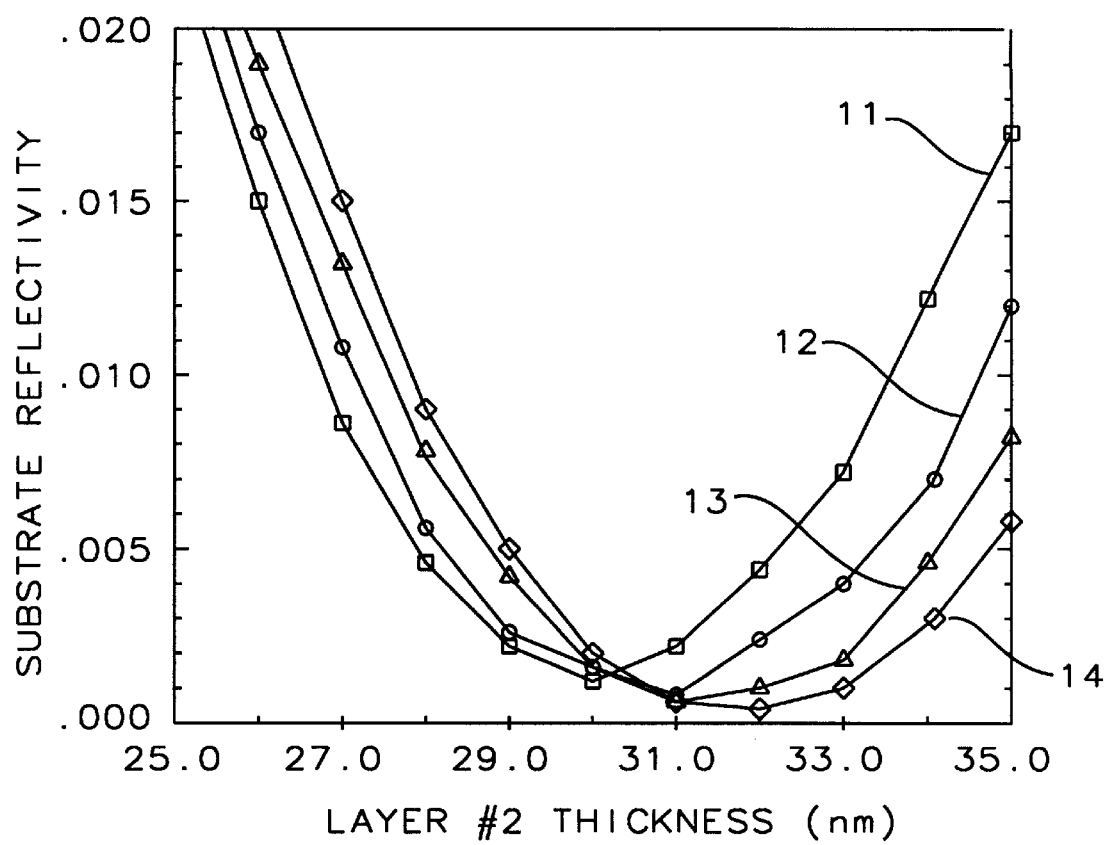
FIG. 1 shows reflectivity of a silicon oxide/oxynitride structure as a function of thickness.

To obtain guidance as to the relative thicknesses of oxide and oxynitride that are required for such a consumable hard mask to also serve as an efficient ARC, the data shown in FIG. 1 was compiled. We show there a family of curves that plot reflectivity of a two layer surface (silicon oxide over silicon oxynitride) as a function of lower layer (#2) thickness for several upper layer (#1) thicknesses. For curve 11, the upper layer thickness was 10 nm, while for curves 12, 13, and 14, the upper layers had thicknesses of 12, 15, and 20 nm respectively.

We will disclose the process of the present invention, which was developed using the data seen in FIG. 1 in combination with etching rate data for these two materials, by describing the formation of a field effect transistor having a narrow gate (width between about 0.13 and 0.15 microns), but it will be recognized that the process is more general than this and could be used for forming narrow lines of polysilicon in other contexts as well.

Figure 2:
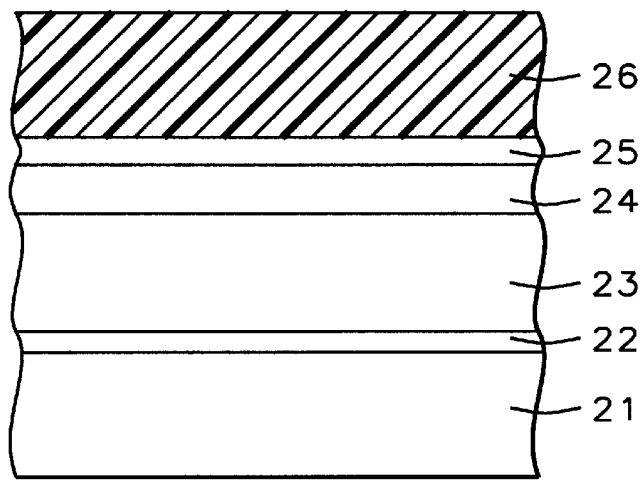
FIG. 2 is the starting point for the process of the present invention.

Referring now to FIG. 2, the process begins with the provision of silicon substrate 21 on whose upper surface a layer of gate oxide 22 is formed. Then, the layer of polysilicon that is to be etched into a gate electrode (layer 23) is deposited over gate oxide layer 22.

Next, in a key feature of the invention, layer 24 of silicon oxynitride and layer 25 of silicon oxide are deposited onto polysilicon layer 23. It is important for the invention to work properly to control the thicknesses of both these layers. Thus, for oxynitride layer 24, the preferred thickness is 300 Angstroms, although any thickness between about 250 and 350 Angstroms could be used without significantly reducing the effectiveness of the process, while for oxide layer 25 the preferred thickness is 150 Angstroms, although any thickness between about 100 and 200 Angstroms could be used without significantly reducing the effectiveness of the process. Then, photoresist layer 26 is coated onto the surface of layer 25 to a thickness between about 0.2 and 0.4 microns. This is a relatively thin layer of photoresist for reasons discussed earlier.

Figure 3:
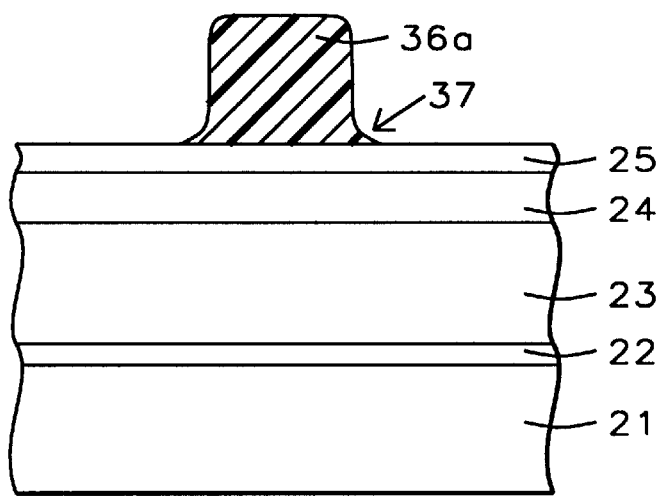
FIGS. 3 and 4 show a photoresist mask before and after trimming.
Figure 5:
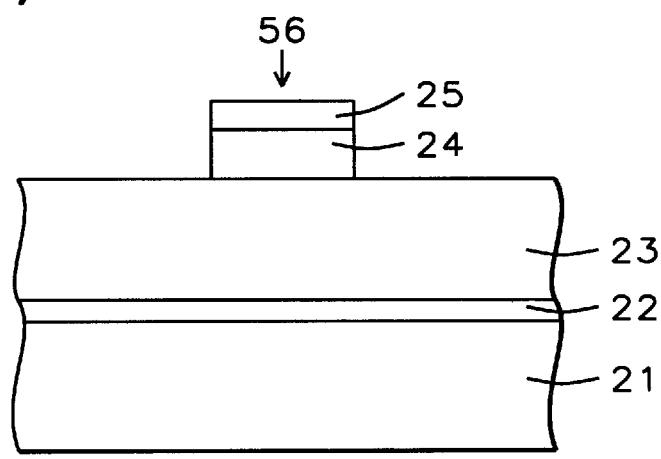
FIG. 5 shows the hard mask before polysilicon etching.

Referring now to FIG. 3, photoresist layer 26 is patterned (exposed through a suitable imaging medium and then developed) to form mask 36a which has the shape of a narrow line and is therefore suitable for etching a narrow gate shape from layer 25 and other layers below it. Then, using hexafluoro-ethane or tetrafluoro-methane as the etchant, all unprotected silicon oxide and silicon oxynitride are removed (while leaving the polysilicon layer unchanged) thereby forming hard mask 56 (which is illustrated in FIG. 5).

Figure 4:
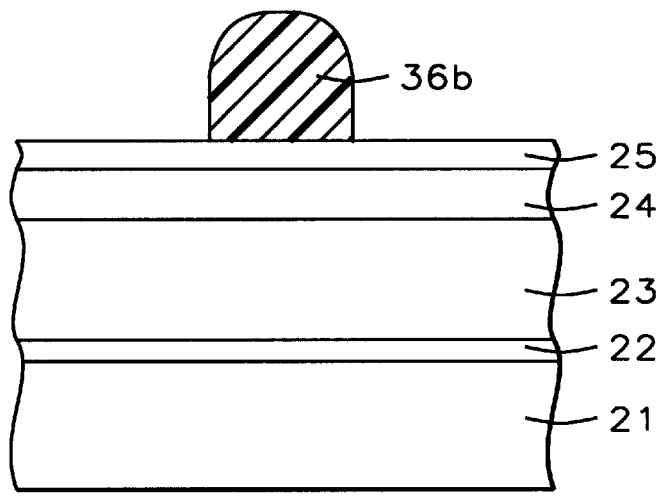

At this stage of the process an optional additional step, namely photoresist trimming, may be introduced. This is accomplished by using chlorine-oxygen or hydrogen bromide-oxygen to trim photoresist and reduce line width and allows for closer line width control. It also has two additional benefits—sloping foot 37 (see FIG. 3) of the resist line profile is removed, allowing the line width to remain constant for its full length (as shown in FIG. 4 for trimmed resist mask 36b), and edge roughness of the line is reduced (not shown).

Figure 6:
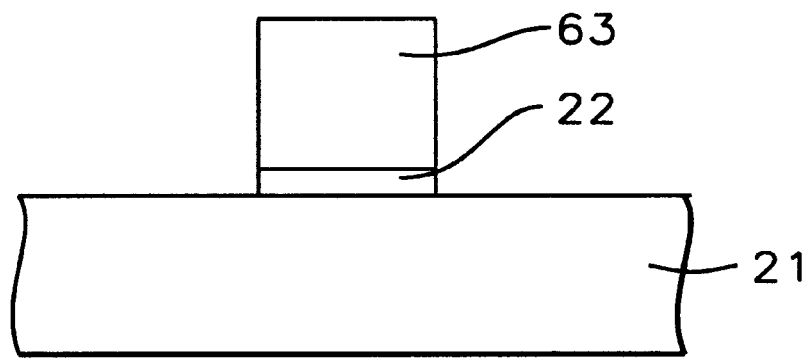
FIG. 6 shows the final gate structure.

At this point (whether or not trimming has been used) all photoresist is removed. Then, using hard mask 56 (FIG. 5), all unprotected polysilicon and gate oxide (layers 22 and 23 respectively) are etched away leaving behind, as seen in FIG. 6, polysilcon gate 63 over gate oxide layer 22. The etchant and etching conditions used for removing the polysilicon were a chlorine/hydrogen bromide/helium oxygen mixture used in combination with a high density plasma source to etch the polysilicon. Under these conditions, at the time that the unprotected polysilicon has been fully removed, all of the silicon oxide that forms the top layer of the hard mask will have been removed as well as a certain amount, but not all, of the silicon oxynitride layer, the amount remaining being generally between about 150 and 200 Angstroms.

The process concludes with the removal of any polymer residue present. This is done using HF and a buffered oxide etch wet dip, followed by the removal of all remaining silicon oxynitride. At this point, conventional processing is resumed. Usually this is the formation of source and drain regions accomplished through ion implanting material into the silicon substrate, using the newly formed gate as a mask.

While the invention has been particularly shown and described with reference to the preferred embodiments thereof, it will be understood by those skilled in the art that various changes in form and details may be made without departing from the spirit and scope of the invention.

What is claimed is:

1. A process for etching a narrow line in polysilicon, comprising:

providing a layer of polysilicon on a substrate;

depositing a layer of silicon oxynitride on said layer of polysilicon;

depositing a layer of silicon oxide on the layer of silicon oxynitride;

coating the layer of silicon oxide with a layer of photoresist;

patterning the photoresist to form a narrow line;

using said photoresist pattern as a mask, etching all unprotected silicon oxide and silicon oxynitride, thereby forming a hard mask;

removing all photoresist;

using the hard mask, fully etching all unprotected polysilicon in a manner whereby all silicon oxide in the hard mask is removed and some thickness of silicon oxynitride in the hard mask remains;

removing any polymer residue present; and then removing all remaining silicon oxynitride.

2. The process of claim 1 further comprising:

after patterning the photoresist and before removing all photoresist, trimming the photoresist thereby reducing its width.

3. The process of claim 2 wherein trimming is achieved by using chlorine-oxygen or hydrogen bromide-oxygen to trim photoresist and reduce line width.

4. The process of claim 1 wherein the layer of silicon oxynitride is deposited to a thickness between about 250 and 350 Angstroms and the layer of silicon oxide is deposited to a thickness between about 100 and 200 Angstroms.

5. The process of claim 1 wherein the coating of photoresist is given a thickness between about 0.2 and 0.4 microns.

6. The process of claim 1 wherein the narrow line has a width between about 0.13 and 0.15 microns.

7. The process of claim 1 wherein the step of etching all unprotected polysilicon in a manner whereby all silicon oxide in the hard mask is removed and some thickness of silicon oxynitride remains is achieved by using a chlorine/hydrogen bromide/helium oxygen mixture in combination with a high density plasma source when etching the polysilicon.

8. The process of claim 1 wherein the step of removing any polymer residue present is achieved by using HF and a buffered oxide etch wet dip.

9. The process of claim 4 wherein the layer of silicon oxynitride remaining after the polysilicon has been fully etched has a thickness between about 150 and 200 Angstroms.

10. A process for forming a field effect transistor having a narrow gate, comprising:

providing a silicon substrate;

forming a layer of gate oxide on said silicon substrate;

depositing a layer of polysilicon on the layer of gate oxide;

depositing a layer of silicon oxynitride, having a thickness between about 300 and 350 Angstroms, on said layer of polysilicon;

depositing a layer of silicon oxide, having a thickness between about 100 and 200 Angstroms, on the layer of silicon oxynitride;

coating the layer of silicon oxide with a layer of photoresist;

patterning the photoresist into a narrow gate shape, having a width between about 0.13 and 0.15 microns;

using said photoresist pattern as a mask, etching all unprotected silicon oxide and silicon oxynitride, thereby forming a hard mask;

removing all photoresist;

using the hard mask, fully etching all unprotected polysilicon and gate oxide in a manner whereby all silicon oxide in the hard mask is removed and some thickness of silicon oxynitride in the hard mask remains, thereby forming the gate;

removing any polymer residue present;

then removing all remaining silicon oxynitride; and using the gate as a mask, ion implanting material into the silicon substrate to form source and drain regions.

11. The process of claim 10 further comprising:

after patterning the photoresist and before removing all photoresist, trimming the photoresist thereby reducing its width.

12. The process of claim 10 wherein the coating of photoresist is given a thickness between about 0.2 and 0.4 microns.

13. The process of claim 10 wherein the step of etching all unprotected polysilicon in a manner whereby all silicon oxide in the hard mask is removed and some thickness of silicon oxynitride remains is achieved by using a chlorine/hydrogen bromide/helium oxygen mixture in combination with a high density plasma source when etching the polysilicon.

14. The process of claim 10 wherein the step of removing any polymer residue present is achieved by using HF and a buffered oxide etch wet dip.

15. The process of claim 10 wherein the layer of silicon oxynitride remaining after the polysilicon has been fully etched has a thickness between about 150 and 200 Angstroms.

* * * * *